United States Patent
Sicard

(10) Patent No.: US 10,146,244 B2
(45) Date of Patent: Dec. 4, 2018

(54) VOLTAGE REFERENCE CIRCUIT

(71) Applicant: NXP USA, Inc., Austin, TX (US)

(72) Inventor: Thierry Sicard, Haute Garonne (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/861,178

(22) Filed: Jan. 3, 2018

(65) Prior Publication Data

US 2018/0246538 A1  Aug. 30, 2018

(30) Foreign Application Priority Data

Feb. 28, 2017 (EP) .................................... 17305216

(51) Int. Cl.
*G05F 1/10* (2006.01)
*G05F 3/22* (2006.01)
*G05F 3/30* (2006.01)
*H03F 1/30* (2006.01)
*H03F 3/45* (2006.01)

(52) U.S. Cl.
CPC ................. *G05F 3/22* (2013.01); *G05F 3/30* (2013.01); *H03F 1/30* (2013.01); *H03F 3/45* (2013.01)

(58) Field of Classification Search
CPC . G05F 3/30; G05F 3/222; G05F 3/242; G05F 3/32
USPC ......................................................... 327/539
See application file for complete search history.

(56) References Cited

U.S. PATENT DOCUMENTS

| | | | |
|---|---|---|---|
| 4,249,122 A | 2/1981 | Widlar | |
| 4,668,069 A * | 5/1987 | Hasegawa | G03B 7/091 396/231 |
| 6,075,354 A | 6/2000 | Smith et al. | |
| 6,172,555 B1 | 1/2001 | Gusinov | |
| 6,232,828 B1 | 5/2001 | Smith et al. | |
| 8,400,213 B2 | 3/2013 | Sicard | |
| 9,110,485 B2 | 8/2015 | Sicard | |
| 9,804,614 B2 * | 10/2017 | Ji | G05F 1/468 |
| 2002/0140477 A1 * | 10/2002 | Zhou | H03K 5/007 327/175 |
| 2007/0279030 A1 | 12/2007 | Cave | |
| 2013/0119967 A1 | 5/2013 | Kiuchi | |
| 2016/0320783 A1 | 11/2016 | Yoshii et al. | |

* cited by examiner

*Primary Examiner* — Dinh T Le

(57) ABSTRACT

A voltage reference circuit comprising: a main amplifier, having an output-terminal for providing a reference-voltage-output-signal, wherein the output-terminal is connected to the first-input-terminal; an offset-stage, connected to at least one of a first-input-terminal and a second-input-terminal of the main amplifier; and a PN junction. The PN junction is configured, in use, to provide a junction-voltage, between the first-junction-terminal and the second-junction-terminal, wherein the junction-voltage decreases with increasing temperature. The offset-stage is configured, in use, to provide an offset-voltage between the first-input-terminal and the second-input-terminal, wherein the offset-voltage increases with increasing temperature.

14 Claims, 12 Drawing Sheets

VOLTAGE REFERENCE CIRCUIT

BACKGROUND

The present disclosure relates to voltage reference circuits, and in particular, although not necessarily, to band-gap voltage reference circuits.

FIG. 1 shows an example of a band-gap voltage reference circuit 100 comprising a first diode 110 (D1), a second diode 112 (D8), a first resistor 114 (R1) and an amplifier 120. The amplifier 120 has two input terminals, a first input terminal 122 and a second input terminal 124, and an output terminal 126. The output terminal 126 provides a reference-voltage-output-signal (which will also be referred to as an output voltage (Vout)), which is the output signal of the band-gap voltage reference circuit 100. This band-gap voltage reference circuit 100 topology uses two branches of input components, one for each of the input terminals, 122, 124, to bias the first diode 110 and the second diode 112, respectively. This voltage biasing creates a potential difference (ΔVD) across the first resistor 114 (R1). The amplifier input terminals are connected at about Vout/2 (at 25 C). The output voltage is approximately 1.2V. The amplifier 120, which does not have a common mode potential difference between the first input terminal 122 and the second input terminal 124, therefore needs a supply voltage that is higher than the output voltage Vout. The supply voltage is provided to the amplifier 120 by the voltage supply terminal (Vsup) 128.

The amplifier 120 is a zero voltage DC offset amplifier. Therefore, for the circuit shown in FIG. 1, the voltage levels at the first input terminal 122 and the second input terminal 124 will be approximately equal. The 0 DC offset amplifier brings its own error at the ΔVbe error. That is, there will be a voltage error between the first input terminal 122 and the second input terminal 124 because of the input components of the amplifier 120, but without a DC value. The voltage error may arise from finite manufacturing tolerances, for example, that result in a time-varying offset voltage being slightly different to zero. This results in more offset error, and so the natural standard deviation of the band-gap value in production will be higher. Also, the first diode 110 (D1) and the second diode 112 (D8) will introduce an error to the DC value of $\Delta V_D$.

A first equation that describes the operation of the circuit of FIG. 1 is shown below.

$$V_{out} = V_{D8} + [1 + (R_2/R_1)]\Delta V_D$$

The first equation describes the relationship between the output voltage Vout, the voltage $\Delta V_D$ across the first resistor 114 and the voltage $V_{D8}$ across the second diode 112, in terms of the resistance $R_1$ of the first resistor 114 and the resistance $R_2$ of a second resistor 116 also present in the circuit 100.

A second equation, which defines the error in the voltage across the first resistor 114 (error($V_{R1}$)), is:

$$\text{error}(V_{R1}) = [(\sigma_{\Delta VD})^2 + (\sigma_{Voff})^2]^{1/2}/(\Delta V_D + 0)$$

Where:
$\Delta V_D$ is the voltage across the first resistor 114,
$\sigma_{\Delta VD}$ is the standard deviation error of the voltage across the first resistor 114 ($\Delta V_D$), and
$\sigma_{Voff}$ is the standard deviation error of the offset voltage between the first 122 and second 124 input terminals.

In the second equation, a zero is shown in the denominator. This zero is shown to reflect the voltage offset having a zero value. Therefore, there is no voltage offset to contribute to any reduction in the overall percentage voltage error.

BRIEF DESCRIPTION OF THE DRAWINGS

The figures and Detailed Description that follow also exemplify various example embodiments. Various example embodiments may be more completely understood in consideration of the following Detailed Description in connection with the accompanying Drawings.

One or more embodiments will now be described by way of example only with reference to the accompanying drawings in which.

DETAILED DESCRIPTION OF THE DRAWINGS

Figure 2:
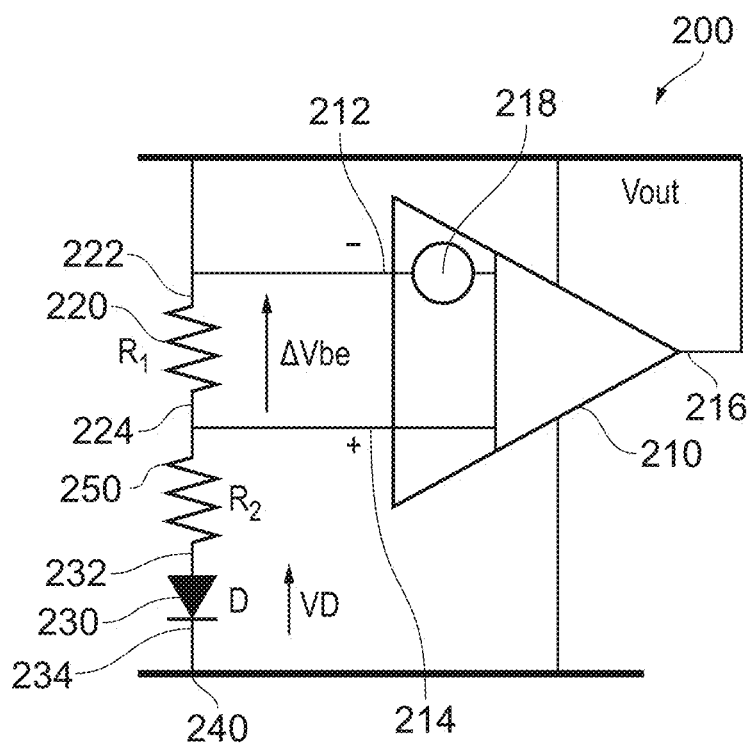
FIG. 2 shows an example embodiment of a voltage reference circuit.

FIG. 2 shows a schematic circuit diagram of an example embodiment of a voltage reference circuit 200. In this example, the voltage reference circuit 200 comprises a main amplifier 210 with a built in offset-voltage (ΔVbe) which is not zero. As described in greater detail below, advantageously the voltage reference circuit 200 provides a reference-voltage-output-signal (Vout) that is based on the sum of two different voltage profiles: (i) the offset-voltage (ΔVbe) (that is built in to the main amplifier 210); and (ii) a junction-voltage (Vbe) (that is provided by a PN junction 230). These two voltage profiles are provided by employing separate components for each profile, in a topology that requires only a single branch of input components. In this example, the branch of input components includes a first resistor 220 (R1), the PN junction 230, and an optional a second resistor 250 (R2).

The main amplifier 210 comprises a first-input-terminal 212, a second-input-terminal 214 and an output-terminal 216. The output-terminal 216 is connected to the first-input-terminal 212. The main amplifier 210 also has an offset-stage 218, connected to at least one of the first-input-terminal 212 and the second-input-terminal 214. In some examples the offset-stage 218 may be connected to both of the first-input-terminal 212 and the second-input-terminal 214. The offset-stage 218 is configured, in use, to provide an offset-voltage $\Delta V_{BE}$ between the first-input-terminal 212 and the second-input-terminal 214. The offset-voltage will increase with increasing temperature. This is inherent to the offset-stage 218 because: $\Delta V_{BE}=kT/q(Ln(N))$; where q is the electron charge (constant), K is the Boltzmann constant, N a constant ratio, and T the absolute temperature in K. Therefore, $\Delta V_{BE}$ has a positive slope with respect to temperature, by definition.

The first resistor (R1) 220 has: (i) a first-resistor-terminal 222 connected to the first-input-terminal 212; and (ii) a second-resistor-terminal 224 connected to the second-input-terminal 214. The PN junction 230 has: (i) a first-junction-terminal 232 connected to the second-resistor-terminal 224; and (ii) a second-junction-terminal 234 connected to a reference terminal 240. In some examples, the reference terminal 240 may be connected to electrical ground, or it may float with respect to ground. In this example, the PN junction 230 is a diode. However, it will be appreciated that any component with a PN junction may be used, such as a transistor connected as a diode, for example a bipolar junction transistor with its collector terminal connected to its base terminal.

The-second resistor 250 is connected in series with the PN junction 230 between: (i) the second-input-terminal 214 of the main amplifier 210, and (ii) the reference terminal 240. The second resistor (R2) 250 is used multiply the $\Delta V_{BE}$ by a factor of R2/R1.

The PN junction 230 is configured, in use, to drop a junction-voltage, between the first-junction-terminal 232 and the second-junction-terminal 234. The junction-voltage will decrease with increasing temperature because of the inherent physical properties of any PN junction.

Since the variation of the offset-voltage (provided by the offset-stage 218 in the main amplifier 210) with respect to temperature is opposite to the variation of the junction-voltage (provided by the PN junction 230) with respect to temperature, the output voltage Vout of the voltage reference circuit 200 will exhibit less variation with respect to temperature than either of the offset-voltage or the junction-voltage. That is, variations in the offset-voltage and the junction-voltage, with respect to temperature, can at least partially cancel each other out.

To a first order, the junction-voltage decreases with increasing temperature with a first gradient. Correspondingly, to a first order, the offset-voltage increases with increasing temperature, with a second gradient. Appropriate choice of component values may provide a magnitude of the first gradient that is within 0.05%, 0.1% or 0.2% of a magnitude of the second gradient, as non-limiting examples. For instance, for a difference of 0.08%, a 1 mV variation over full range temperature is achieved for an output voltage of 1.25V ($\frac{1}{1250}$=0.08%). The output voltage may consequently show a very low variation over a range of temperatures, because the variation of the junction-voltage can be configured to cancel out the variation of the offset-voltage over the temperature range concerned. Second and higher order effects may result in small variations of the output voltage with respect to temperature. Such variations may be within plus or minus 1 mV of a preferred voltage over a range in excess of 200 degrees Celsius (generally from −50 to 150 C), which can be acceptable in some applications. The preferred voltage may be approximately equal to 1.2V, in some examples.

A third equation, which describes the operation of the circuit of FIG. 2, is:

$$V_{out}=V_D+[1+(R_2/R_1)]\Delta V_{be}$$

The third equation defines the output voltage $V_{out}$ of the voltage reference circuit 200 of FIG. 2 in a way that is comparable to the first equation. For the third equation:

$V_D$ is the voltage dropped across the PN junction 230;
R2 is the resistance of the second resistor 250;
R1 is the resistance of the first resistor 220; and
$\Delta V_{be}$ is the offset-voltage provided by the offset-stage 218.

A fourth equation, which defines the error of the voltage reference circuit 200, is shown below. The offset error of the amplifier 218 comes mainly from its inputs components.

$$\text{error}=\sigma_{off}/V_{be}$$

Where:
$\sigma_{off}$ is the standard deviation error of the offset-voltage provided by the offset-stage 218; and
$\Delta V_{be}$ is the offset-voltage provided by the offset-stage 218.

Figure 1:
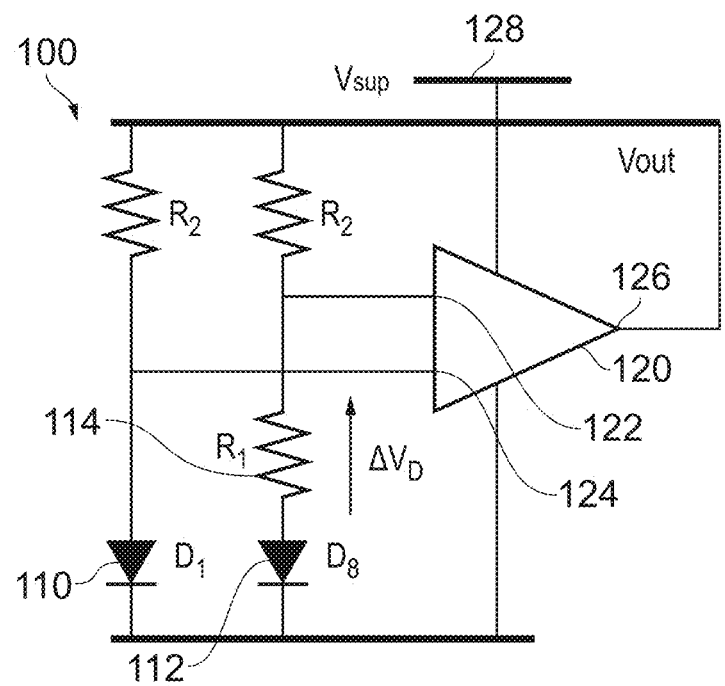
FIG. 1 shows an example of a voltage reference circuit.

The fourth equation defines the error of the voltage reference circuit 200 of FIG. 2 in a way that is comparable to the second equation associated with FIG. 1. The error defined by the fourth equation depends on only the standard deviation ($\sigma_{off}$) of the offset voltage $\Delta V_{be}$, whereas the error defined by the second equation depends on both the standard deviation of the voltage across a resistor, and the standard deviation of the offset voltage. Therefore, the voltage reference circuit 200 of FIG. 2 can have a smaller error than the voltage reference circuit of FIG. 1.

An offset error of the main amplifier 210 of FIG. 2 is included in the offset-voltage that is provided by the built-in offset stage 218. That is, the offset error of the main amplifier 210 is not as significant as it was for the circuit of FIG. 1 because it is added to a non-zero value for the offset voltage of the main amplifier 210. The percentage error ($\sigma/\Delta Vbe$) is thereby reduced because the standard deviation ($\sigma$) relates to the offset-voltage of the main amplifier 210 alone, and not to any other components. In this way, there is only a single source of error, unlike the example shown in FIG. 1, where two different offset errors are combined to provide the total voltage error. This provides for an advantageous reduction in the error of the voltage reference circuit. This error reduction enables this voltage reference circuit 200 topology of FIG. 2 to provide both: a more uniform reference voltage across a wide range of operating temperatures for a particular circuit; and a reduced variability between different circuits manufactured according to the same design.

Figure 3:
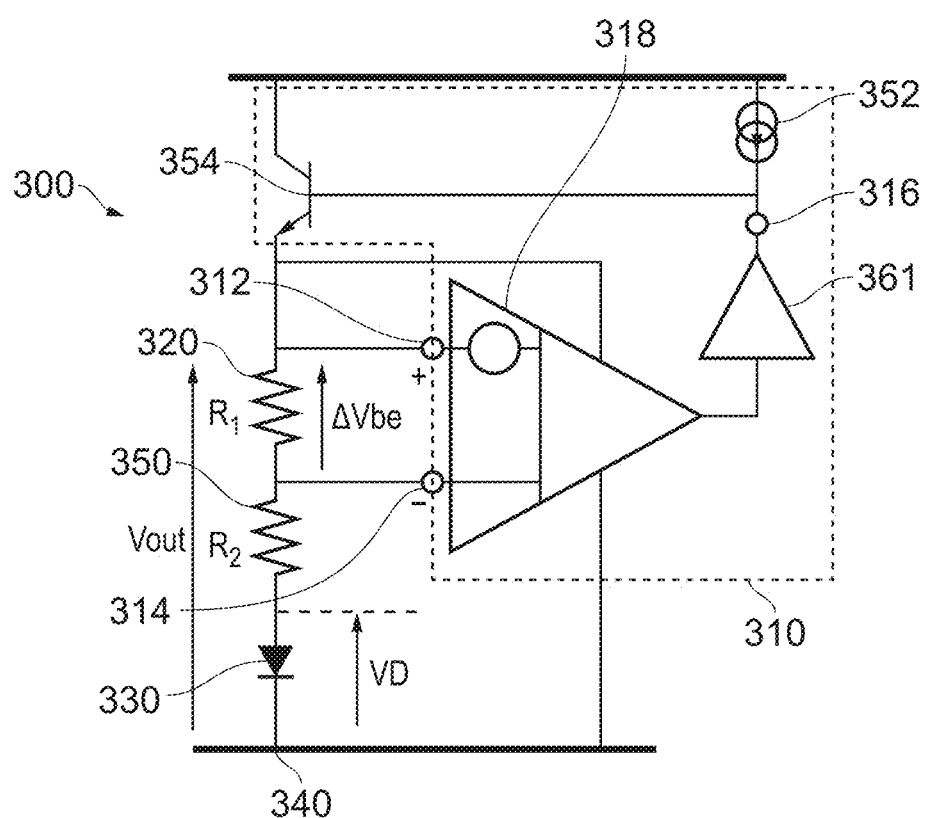
FIG. 3 shows another example embodiment of a voltage reference circuit.

FIG. 3 shows a schematic circuit diagram of a voltage reference circuit 300 similar to the voltage reference circuit shown in FIG. 2. Features in the voltage reference circuit 300 of FIG. 3 that are similar to features of FIG. 2 have been given similar reference numerals, and will not necessarily be described further here.

In the voltage reference circuit 300 of FIG. 3, the main amplifier 310 comprises an offset-stage 318 and an output amplifier. The output amplifier in this example includes an output-sub-amplifier 361, a current source 352 and a transistor 354. The current source 352 and the transistor 354 provides a follower stage to close the loop. Characteristics of the offset-stage 318 and the output amplifier will be further described in relation to the circuit shown in FIG. 4, which is discussed below.

Voltage reference circuits that have the topology presented in FIGS. 2 and 3 separate the generation of the two voltages Vbe and ΔVbe that have opposite gradients with respect to temperature variation. This enables optimization of the components responsible for each voltage separately. A single resistor-biased PN junction can be used to provide the junction-voltage Vbe and an amplifier with a built in offset-voltage can provide a voltage proportional to ΔVbe.

Figure 4:
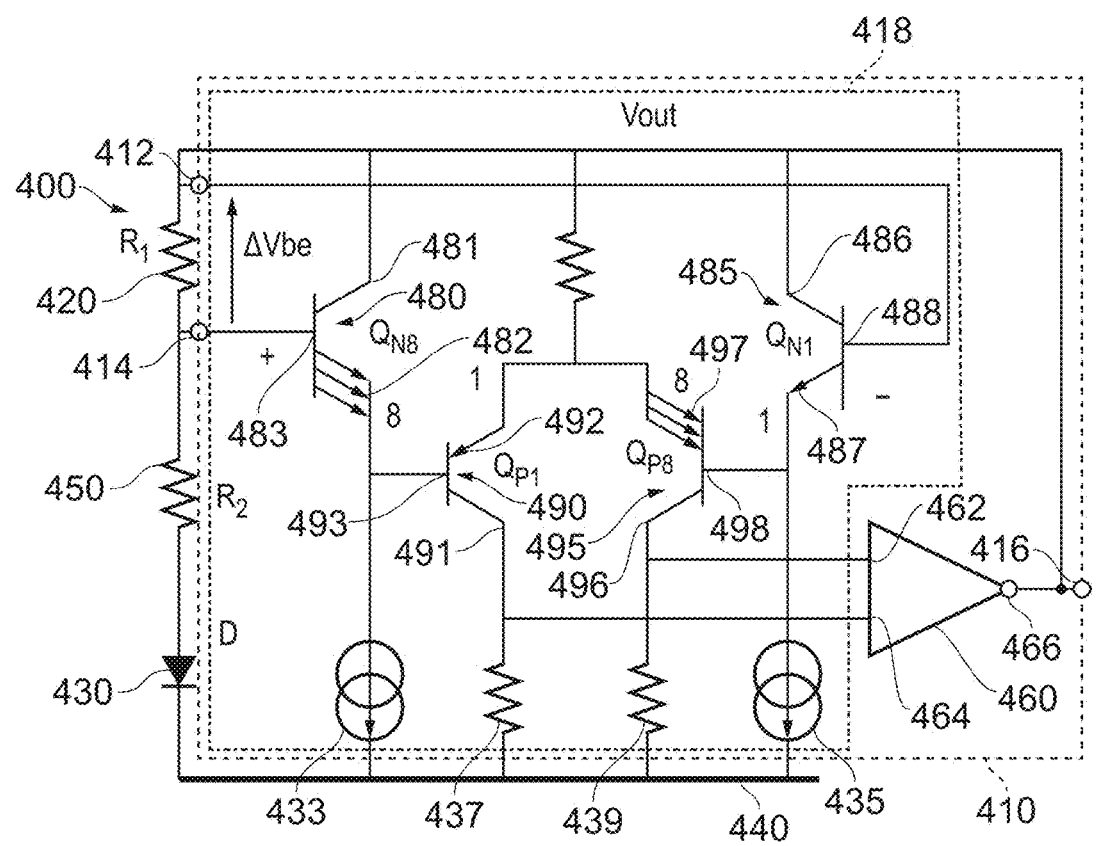
FIG. 4 shows an example embodiment of a voltage reference circuit, similar to the circuit of FIG. 2, in greater detail.

FIG. 4 shows a more detailed schematic circuit diagram of a voltage reference circuit 400 similar to that shown in FIG. 2. Features of FIG. 4 that are similar to features of FIG. 2 have been given similar reference numerals and may not necessarily be discussed further here.

FIG. 4 provides more details about the main amplifier 410 which is configured to provide a built in ΔVbe input offset. The main amplifier 410 has an offset-stage 418 which may also be described as a differential stage or an offset-amplifier. The main amplifier 410 also has an output amplifier 460, which is illustrated in FIG. 3 as an output-sub-amplifier, a current source and a transistor.

The output amplifier 460 has an output-amplifier-first-input-terminal 462, an output-amplifier-second-input-terminal 464, and an output-amplifier-output-terminal 466. The output-amplifier-output-terminal 466 is connected to the output-terminal 416 of the main amplifier 410.

The offset-stage 418 provides signals to the output-amplifier-first-input-terminal 462 and the output-amplifier-second-input-terminal 464 such that an offset voltage is created between the first-input-terminal 412 and the second-input-terminal 414 of the main amplifier 410.

In this example the offset-stage 418 includes four bipolar junction transistors: a larger-area-NPN-transistor 480 (QN8), a smaller-area-NPN-transistor 485 (QN1), a smaller-area-PNP-transistor 490 (QP1) and a larger-area-PNP-transistor 495 (QP8).

The larger-area-NPN-transistor 480 has: (i) a collector terminal 481 coupled to an output-terminal 416 of the main amplifier 410; (ii) an emitter terminal 482 coupled to a reference terminal 440; and (iii) a base terminal 483 coupled to a second-input-terminal 414 of the offset stage 418.

The smaller-area-NPN-transistor 485 has: (i) a collector terminal 486 coupled to the output-terminal 416 of the main amplifier 410; (ii) an emitter terminal 487 coupled to the reference terminal 440; and (iii) a base terminal 488 coupled to the first-input-terminal 412 of the offset-stage 418.

A current source 433 is connected in series between: (i) the emitter terminal 482 of the larger-area-NPN-transistor 480; and (ii) the reference terminal 440. Similarly, a current source 435 is connected in series between: (i) the emitter terminal 487 of the smaller-area-NPN-transistor 485; and (ii) the reference terminal 440.

It will be appreciated that bipolar junction transistors can be said to have a current-conduction-area, between collector and emitter terminals, that enables the transistor to conduct current when the transistor is in an active mode. In the offset-stage 418, the larger-area-NPN-transistor 480 has a bigger current-conduction-area than the smaller-area-NPN-transistor 485. The difference in current-conduction-areas will result in a difference in current density in the respective components. The difference in current density will result in a non-zero offset-voltage between the first-input-terminal 412 and the second-input-terminal 414.

The larger-area-PNP-transistor 495 has: (i) a collector terminal 496 coupled to the reference terminal 440; (ii) an emitter terminal 497 coupled to the output-terminal 416 of the main amplifier 410; and (iii) a base terminal 498 coupled to the emitter terminal 487 of the smaller-area-NPN-transistor 485.

The smaller-area-PNP-transistor 490 has: (i) a collector terminal 491 coupled to the reference terminal 440; (ii) an emitter terminal 492 coupled to the output-terminal 416 of the main amplifier 410; and (iii) a base terminal 493 coupled to the emitter terminal 482 of the larger-area-NPN-transistor 480.

The collector terminal 496 of the larger-area-PNP-transistor 495 is connected to the output-amplifier-first-input-terminal 462. The collector terminal 491 of the smaller-area-PNP-transistor 490 is connected to the output-amplifier-second-input-terminal 464.

An impedance 437 (which in this example is a resistor) is connected in series between: (i) the collector terminal 491 of the smaller-area-PNP-transistor 490; and (ii) the reference terminal 440. Similarly, an impedance 439 (which in this example is a resistor) is connected in series between: (i) the collector terminal 496 of the larger-area-PNP-transistor 495; and (ii) the reference terminal 440. The impedances 437, 439 can be used to drop voltages such that voltage signals are provided to the input terminals 462, 464 of the output amplifier 460.

A current-conduction-area of the larger-area-PNP-transistor 495 is bigger than a current-conduction-area of the smaller-area-PNP-transistor 490. This difference in area will also contribute to the non-zero offset-voltage between the first-input-terminal 412 and the second-input-terminal 414.

In the voltage reference circuit 400 a ratio of the current-conduction-area of the larger-area-NPN-transistor 480 to the current-conduction-area of the smaller-area-NPN-transistor 485 is the same as a ratio of the current-conduction-area of the larger-area-PNP-transistor 495 to the current-conduction-area of the smaller-area-PNP-transistor 490. It will be appreciated that these ratios need not be the same, and could instead be different.

In this example, the current-conduction-area of the larger-area-NPN-transistor 480 is 8 times greater than the current-conduction-area of the smaller-area-NPN-transistor 485. Similarly, the current-conduction-area of the larger-area-PNP-transistor 495 is 8 times greater than the current-conduction-area of the smaller-area-NPN-transistor 490. However, it will be appreciated that other ratios may also be employed, for example the ratio of current-conduction-areas may be two, or at least two, or may be four, or at least four, or at least eight, or greater than eight, or at least sixteen, or greater than sixteen. Selecting a ratio can involve accepting a trade-off with the additional area of silicon required to implement a higher ratio.

The ratio of the size of the current-conduction-areas of a larger-area-transistor to a smaller-area-transistor may also be described as the emitter ratio. Since the emitter ratio is eight for the NPN transistors 480, 485 and is also eight for the PNP transistors 490, 495, the offset-stage 418 can be considered as providing a double offset-voltage (ΔVbe) (which may be written as the sum of two sub-voltage-offsets: ΔVbeNPN+ΔVbePNP). In this example, both of these sub-offset-voltages is 60 mV, which provides a total offset-voltage of 60 mV+60 mV=120 mV. The offset-voltage will be the average of the variation of both of the sub-offset voltages (as described with reference to equations below) with a consequently reduced standard deviation (which persons skilled in the art will appreciate will be divided by approximately the square root of 2 if both sub-offset-voltages have approximately the same value). As ΔVbeNPN and ΔVbePNP are not correlated, there is a small likelihood that they will be at their maximum or minimum values at the same time (in mathematical language they combine by way of quadratic sum).

Below we disclose theoretical calculations of voltage errors assuming a standard deviation of voltage errors of 1 mV. These calculations indicate what the total percentage voltage error may be expected to be, on average, for a sample of different circuits, where each sample is constructed according one of the two different topologies illustrated by FIGS. 1 and 4, respectively.

Below we disclose a first set of calculations that relate to voltage reference circuits 400 with the topology illustrated by FIG. 4.

$$\sigma_{off} = [(\sigma_{NPN})^2 + (\sigma_{PNP})^2]^{1/2}$$

$$error(V_{R1}) = \sigma_{off}/(\Delta V_{NPN} + \Delta V_{PNP})$$

$$error(V_{R1}) = 1\ mV/(60\ mV + 60\ mV) = 1/120 = 0.0083$$

In this example, the standard deviation of the voltage error is a combination the voltage errors associated with both the NPN transistors 480, 490, and the PNP transistors 485, 495. Using an equation similar to the fourth equation presented above, the percentage voltage error may be computed. In this example, the standard deviation of voltage error is assumed to equal 1 mV as a result of manufacturing tolerances. The result of the computation shows that with an offset-voltage of 120 mV, as in the example of FIG. 4, the total percentage voltage error is about 0.8%.

To provide a comparison with circuits having the topology illustrated by FIG. 1, below we disclose a corresponding set of calculations to those presented above in relation to FIG. 4.

$$V_{R1} = V_{off} + \Delta V_D$$

$$\sigma_{\Delta VD} = 1\ mV$$

$$\sigma_{Voff} = 1\ mV$$

$$error(V_{R1}) = [(\sigma_{\Delta VD})^2 + (\sigma_{Voff})^2]^{1/2}/(\Delta V_D + 0)$$

$$error(V_{R1}) = 2^{1/2}/60 = 0.023$$

The percentage voltage error is computed using an equation similar to the second equation disclosed above. Again, standard deviations of voltages are assumed to be 1 mV. The addition of both offset error and zero DC offset voltage errors caused by the amplifier, results in the percentage voltage error of the voltage reference circuit topology of FIG. 1 being equal to 2.3%. This demonstrates that the voltage reference circuit 400 topology illustrated by FIG. 4 provides for an improvement that makes this voltage reference circuit 400 topology almost three times better than the voltage reference circuit topologies corresponding to the circuit of FIG. 1, in terms of percentage voltage error.

In some examples, the voltage reference circuit of FIG. 4 can be implemented with just the NPN transistors 480, 485, such that the PNP transistors 490, 495 that are shown in FIG. 4 can be left out.

It will be appreciated that, alternatively, a voltage reference circuit that is similar to FIG. 4 may have an offset-stage with only two PNP transistors (and not the NPN transistors that are shown in FIG. 4). There may be a larger-area-PNP-transistor, such as the larger-area-PNP-transistor 495, with: (i) a collector terminal 496 coupled to the reference terminal 440, (ii) an emitter terminal 497 coupled to the output-terminal 416, and (iii) a base terminal 498 coupled to the first-input-terminal 412. There may also be a smaller-area-PNP-transistor, such as the smaller-area-PNP-transistor 490, with: (i) a collector terminal 491 coupled to the reference terminal 440, (ii) an emitter terminal 492 coupled to the output-terminal 416, and (iii) a base terminal 493 coupled to the second-input-terminal 414. In such a circuit, the current-conduction-area of the larger-area-PNP-transistor can be greater than a current-conduction-area of the smaller-area-PNP-transistor, in order to provide for the non-zero offset-voltage.

It will also be appreciated that, more generally, a voltage reference circuit according to the present disclosure may comprise an offset-stage with a larger-area-transistor (such as either the larger-area-NPN-transistor 480, or the larger-area-PNP-transistor 495) and a smaller-area-transistor (such as either the smaller-area-NPN-transistor 485 or the smaller-area-PNP-transistor 490). The larger-area-transistor may have: (i) a conduction channel connected in series between the output-terminal 416 of the main amplifier 410 and the reference terminal 440, and (ii) a control terminal connected to one of either the first-input-terminal 412, or the second-input-terminal 414 of the main amplifier 410. The conduction channel may extend between a collector terminal and an emitter terminal in a bipolar junction transistor. The control terminal may be a base terminal of a bipolar junction transistor. The smaller-area-transistor may have a conduction channel connected in series between the output-terminal 416 of the main amplifier 410 and the reference terminal 440. The smaller-area-transistor may have a control terminal connected to one of either: the first-input-terminal 412 of the main amplifier 410, when the control terminal of the larger-area-transistor is connected to the second-input-terminal 414; or the second-input-terminal 414 of the main amplifier 410, when the control terminal of the larger-area-transistor is connected to the first-input-terminal 412. A current-conduction-area of the larger-area-transistor may be greater than a current-conduction-area of the smaller-area-transistor, in order to provide for the non-zero offset-voltage.

As indicated above, the main amplifier 410 includes an output amplifier 460. Advantageously, the main amplifier 410 can be provided with a supply voltage from the output voltage provided at the output terminal 416 of the main amplifier 410. As shown schematically in FIG. 2, the voltage supply terminal of the main amplifier is connected directly to Vout. As also shown in FIG. 4, which provides example implementation details of the main amplifier 410, the conduction channels of the transistors are connected between Vout and the reference terminal. This can be considered as providing a simplification over the circuit of FIG. 1, because there is consequently no need for another voltage supply. This advantage can arise due to the topology of the voltage-reference-circuit 400 with the first input terminal 412 and the second input terminal 414 connected to the output voltage Vout. Consequently, the bipolar junction transistors 480, 485, 490, 495 have enough input common mode voltage to function successfully.

Figure 5:
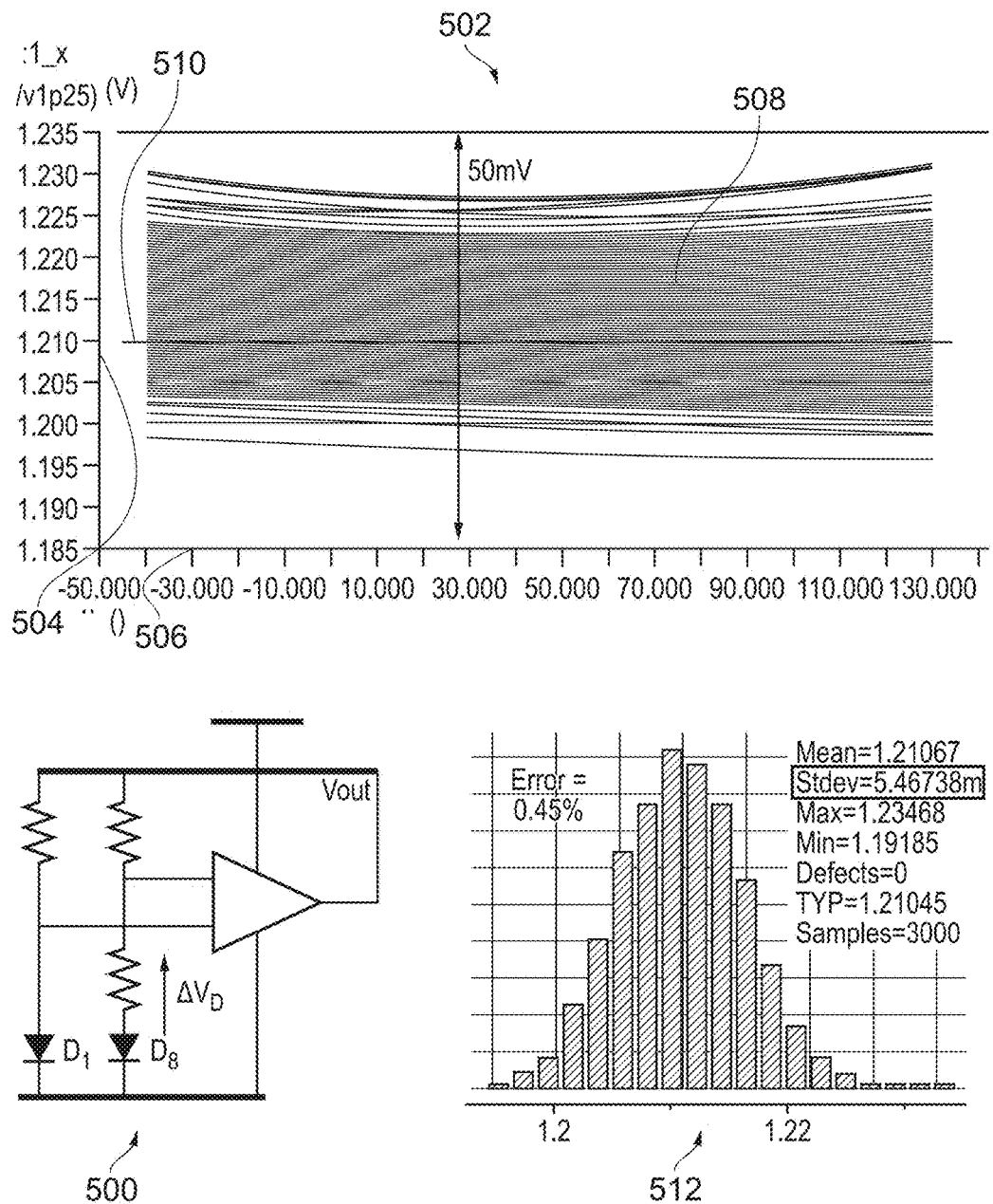
FIG. 5 shows an example embodiment of a set of computer simulation results and charts showing an analysis of voltage errors.
Figure 5:
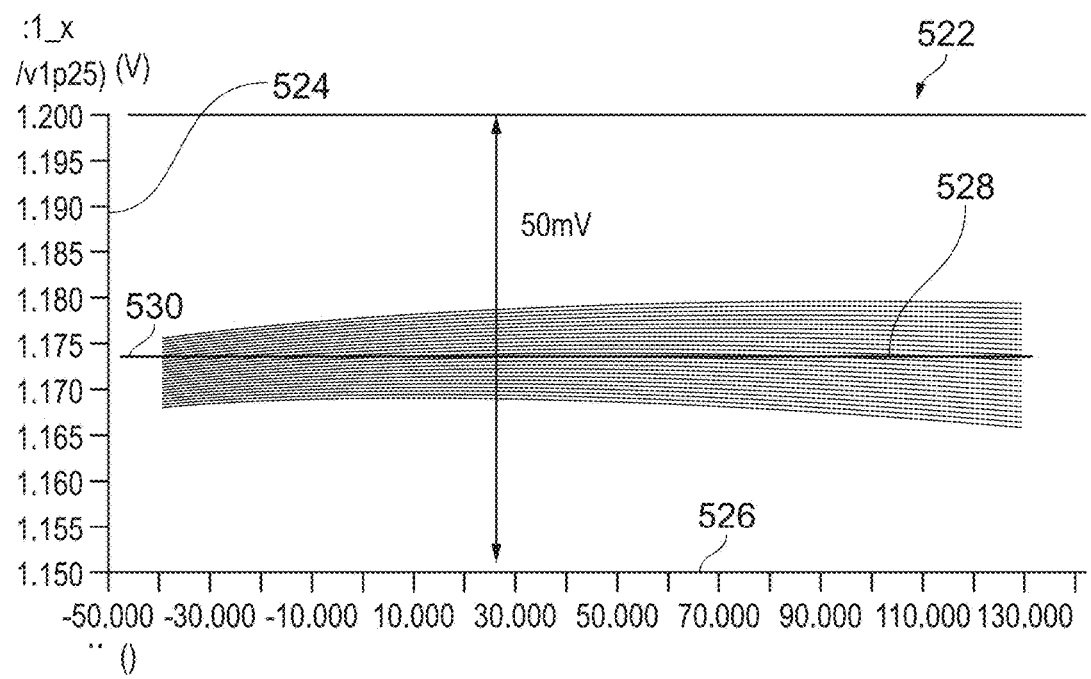
Figure 5:
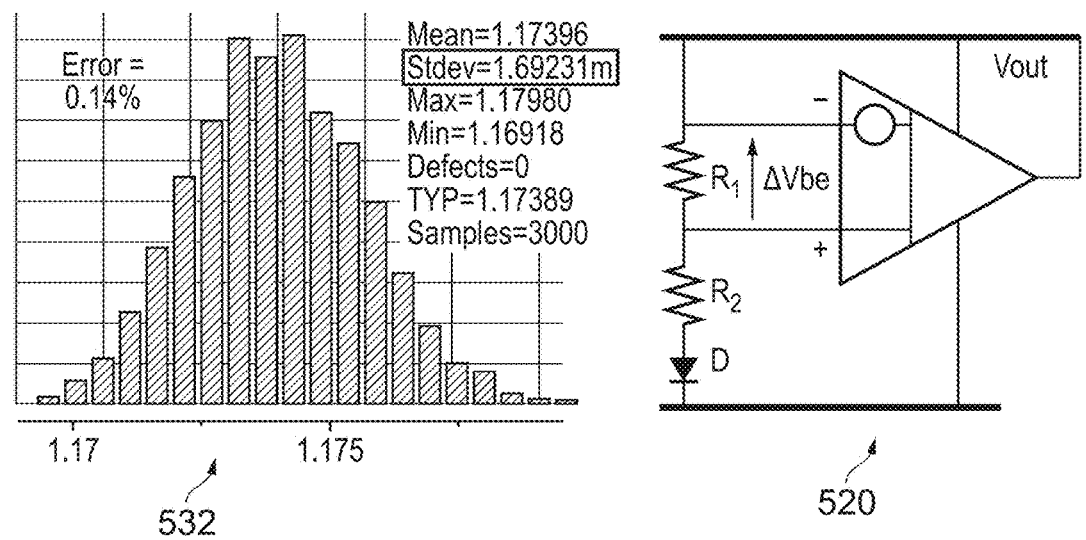

FIG. 5 shows results of six thousand statistical simulations performed to compare the behaviour of voltage reference circuits of a first topology 500, similar to that shown in FIG. 1, with voltage reference circuits of a second topology 520, similar to that shown in FIG. 2, where a built-in voltage offset ΔVbe is present. Each individual simulation generates simulation data that provide a variation in output voltage for a particular simulated circuit as a function of temperature. Results 508 for three thousand simulated circuits of the first topology 500 are shown in a first chart 502, which plots voltage on a vertical axis 504 and temperature on a horizontal axis 506. An analysis of the results of the first chart, in particular a distribution of voltage errors, by which individual circuits deviate away from a design specification voltage 510 are shown in a second chart 512. The standard deviation of these voltage errors corresponds to 0.45% of the design specification voltage.

A third chart 522 shows simulation results 528 for three thousand simulated circuits of the second topology 520 with a built-in voltage offset ΔVbe. Again, voltage is plotted on a vertical axis 524 while temperature is plotted on a horizontal axis 526. A second design specification voltage 530 is shown on the third chart 522. It is readily apparent that the circuits of the second topology 520 show much less deviation away from the second design specification voltage 530 than shown by the circuits of the first topology 500 with respect to its design specification voltage 510. A fourth chart 532 shows a statistical analysis of the simulation results of the third chart 522. The standard deviation of these voltage errors corresponds to 0.14% of the second design specification voltage 530. Thus, there is a clear advantage to using the second topology 520 over the first topology 500: the second topology provides for a substantially smaller voltage error, on average, across a plurality of voltage reference circuits of the second topology 520 compared the first topology 500.

It can be seen from FIG. 5 that the standard deviation of the voltage error is 1.69 mV for simulated circuits of the second topology 520 compared to a standard deviation of 5.46 mV for simulated circuits of the first topology 500. The ratio of these errors is 0.45/0.14=3.2. This ratio is quite close to the result of the more basic sets of calculations discussed above in relation to FIGS. 1 and 2.

Figure 6:
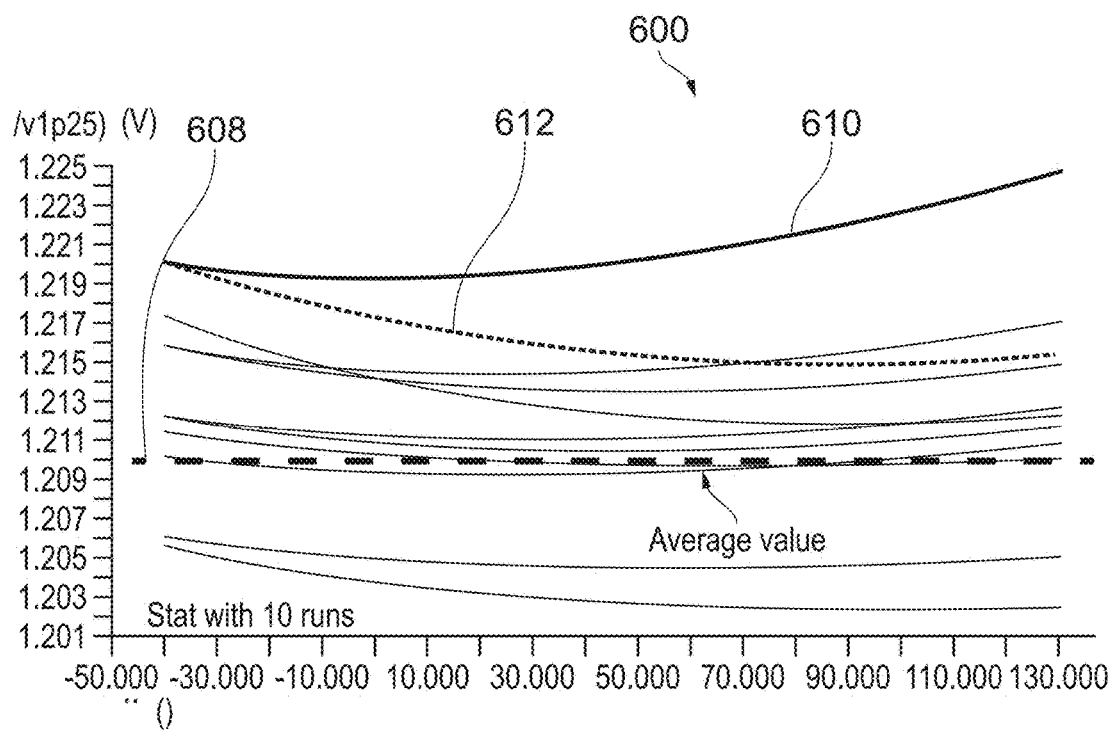
FIG. 6 shows an example embodiment of a set of computer simulation results.
Figure 6:
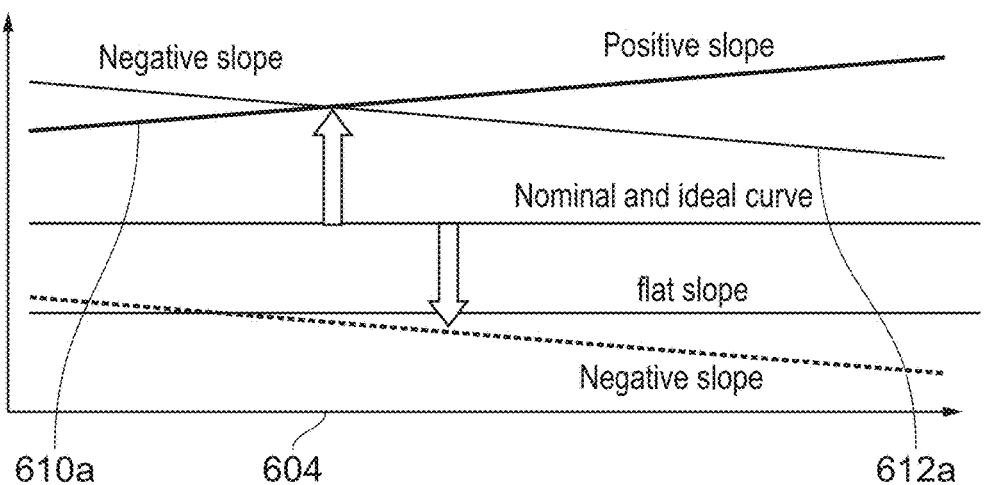
Figure 6:
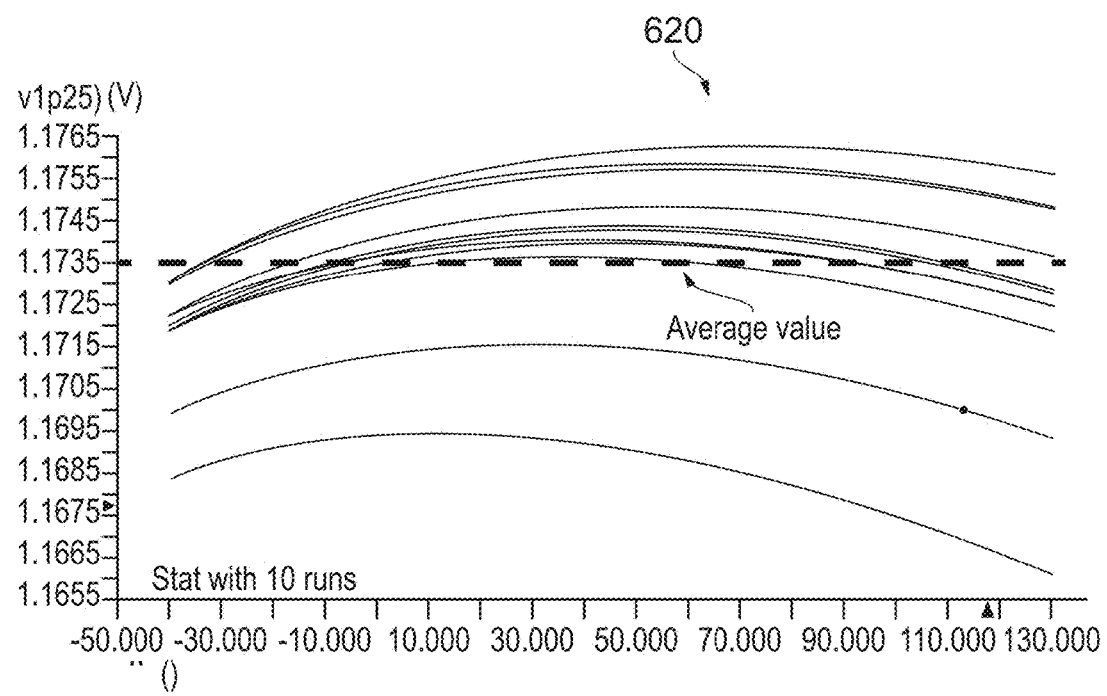
Figure 6:
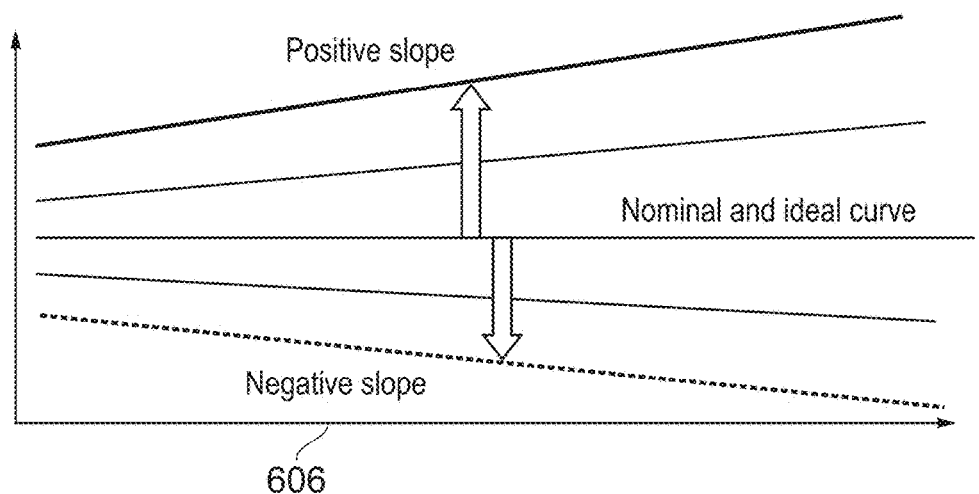

FIG. 6 shows a first chart 600 of simulation results for circuits with the first topology and a second chart 620 of simulation results for circuits with the second topology, with a built-in voltage offset ΔVbe. These simulation results provide information about the quality of the voltage reference circuits of the first and second topologies. As discussed above, the voltage output provided by a voltage reference circuit can be considered as the sum of two voltages, one with a positive slope versus temperature (ΔVbe) and a second one with negative slope with respect to temperature (Vbe). If the output voltage is nominal (which may be either equal to a preferred design specification voltage or to an average value of the distribution of a plurality of actual circuits) the voltage slope versus temperature should be flat (0V/K). Of course, due to the mismatch of the different components, arising from variations in manufacturing tolerances, it is not perfectly flat and some voltage outputs will be over or under the nominal value.

Usually, if the voltage output value at 25 Celsius is higher than the nominal value, then a coefficient associated with the positive slope (due to ΔVbe) has a higher magnitude than a coefficient associated with the negative slope (due to Vbe). Therefore, the slope of the output voltage with respect to temperature should be positive. Similar reasoning applies if the output voltage is below the nominal value, in which case the slope of the output voltage with respect to temperature should be negative.

In the first chart 600 ten statistical simulations are shown for simulations of the first topology, while the second chart 620 presents results for ten statistical simulations for the second topology. The output voltage has a certain curvature due to the non-linearity of the junction voltage (Vbe) versus temperature. To simplify the results, linearized versions of some of the results shown in the first chart 600 are presented in a third chart 604, while linearized versions of some of the results shown in the second chart 620 are shown in a fourth chart 606; in both instances the output voltage curves are replaced by straight line approximations. In the first topology simulations it is easy to see that for the ten simulations, there are a number of sets of results above the nominal value 608, including: a first simulation result 610, 610a, with positive slope; and a second simulation result 612, 612a, with a negative slope. This arises as a consequence of the first topology providing two separate offset errors in generating the offset-voltage (ΔVbe).

The fourth chart 606 does not show any curves with an incorrect slope. That is, each simulation result that has a value that is greater than the average/nominal value at 25° C. has a positive slope. Similarly, each simulation result that has a value that is less than the average/nominal value at 25° C. has a negative slope. This beneficial behaviour is illustrated by the fact that the voltage curves shown on the second chart 620 for different simulations do not cross over one another.

Figure 7:
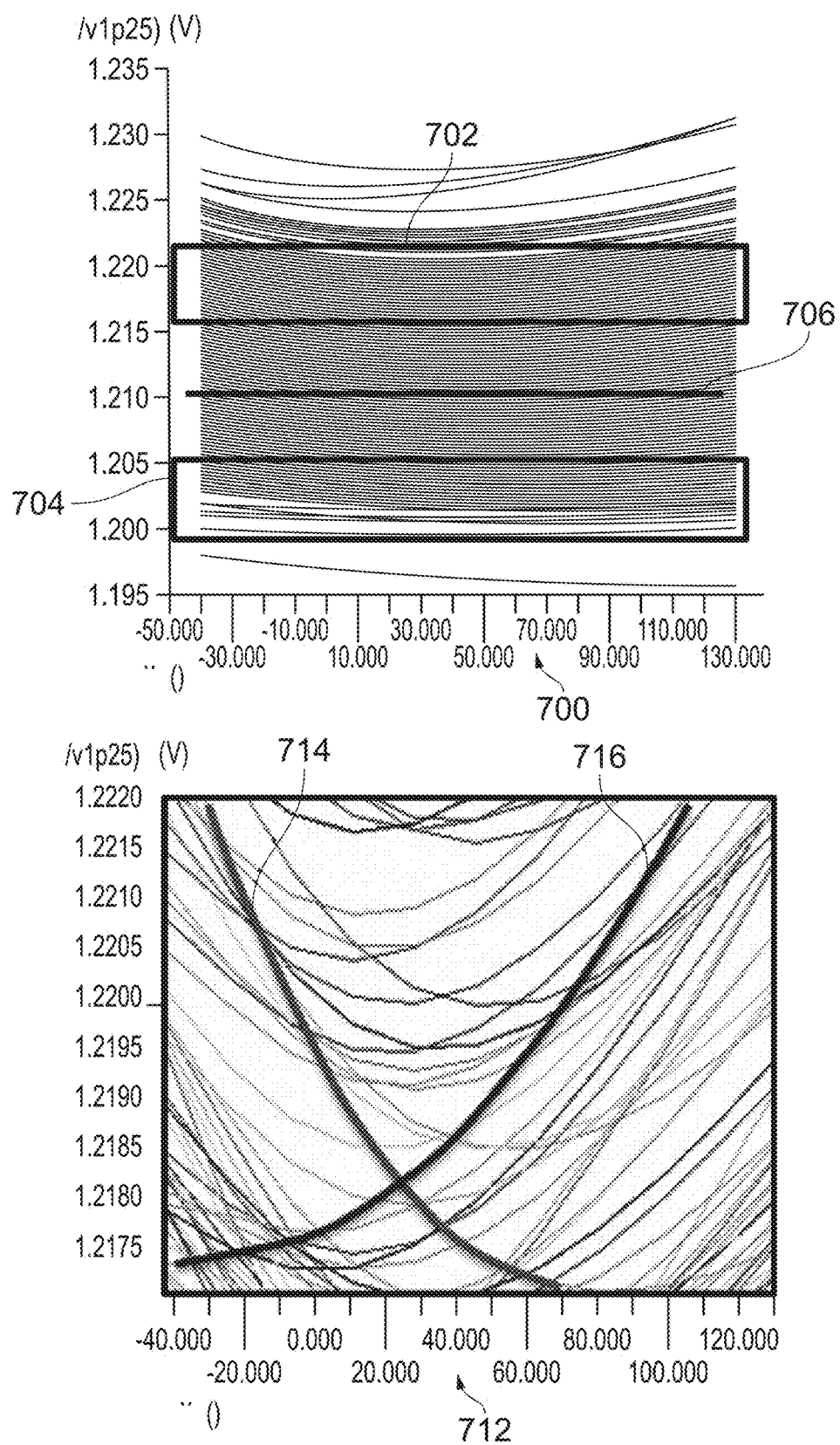
FIG. 7 shows an example of a set of computer simulation results, including expanded portions of some results that show greater detail.
Figure 7:
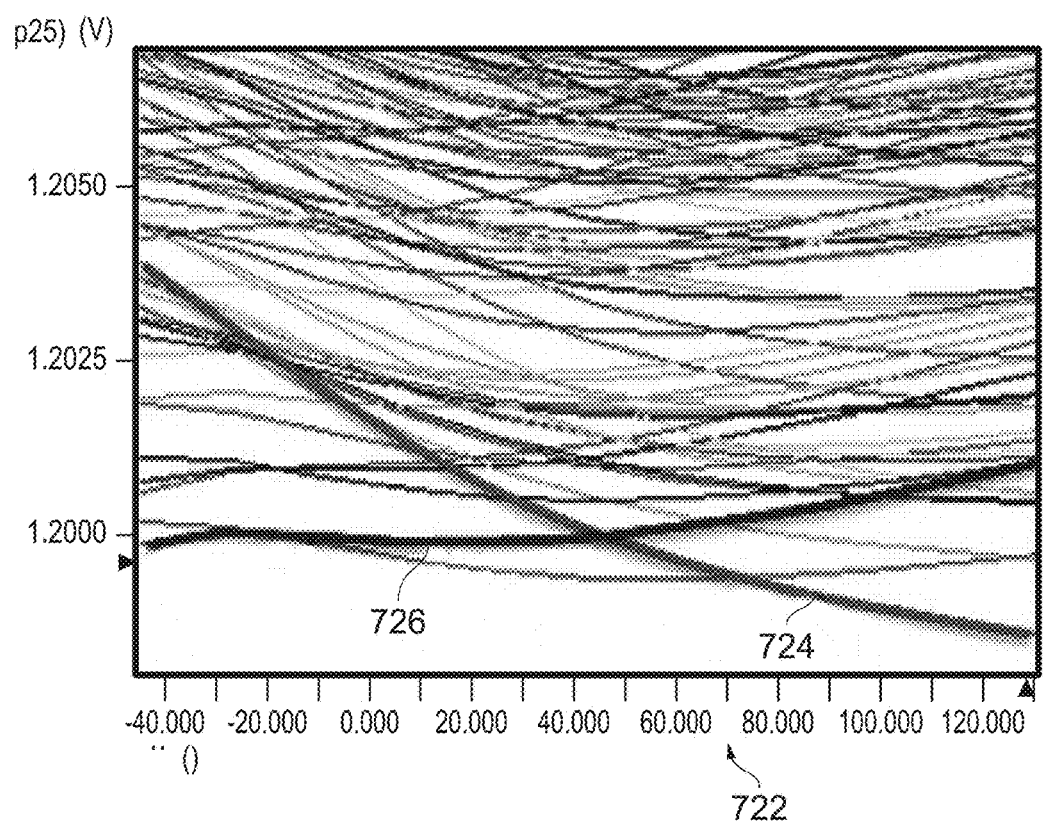
Figure 8:
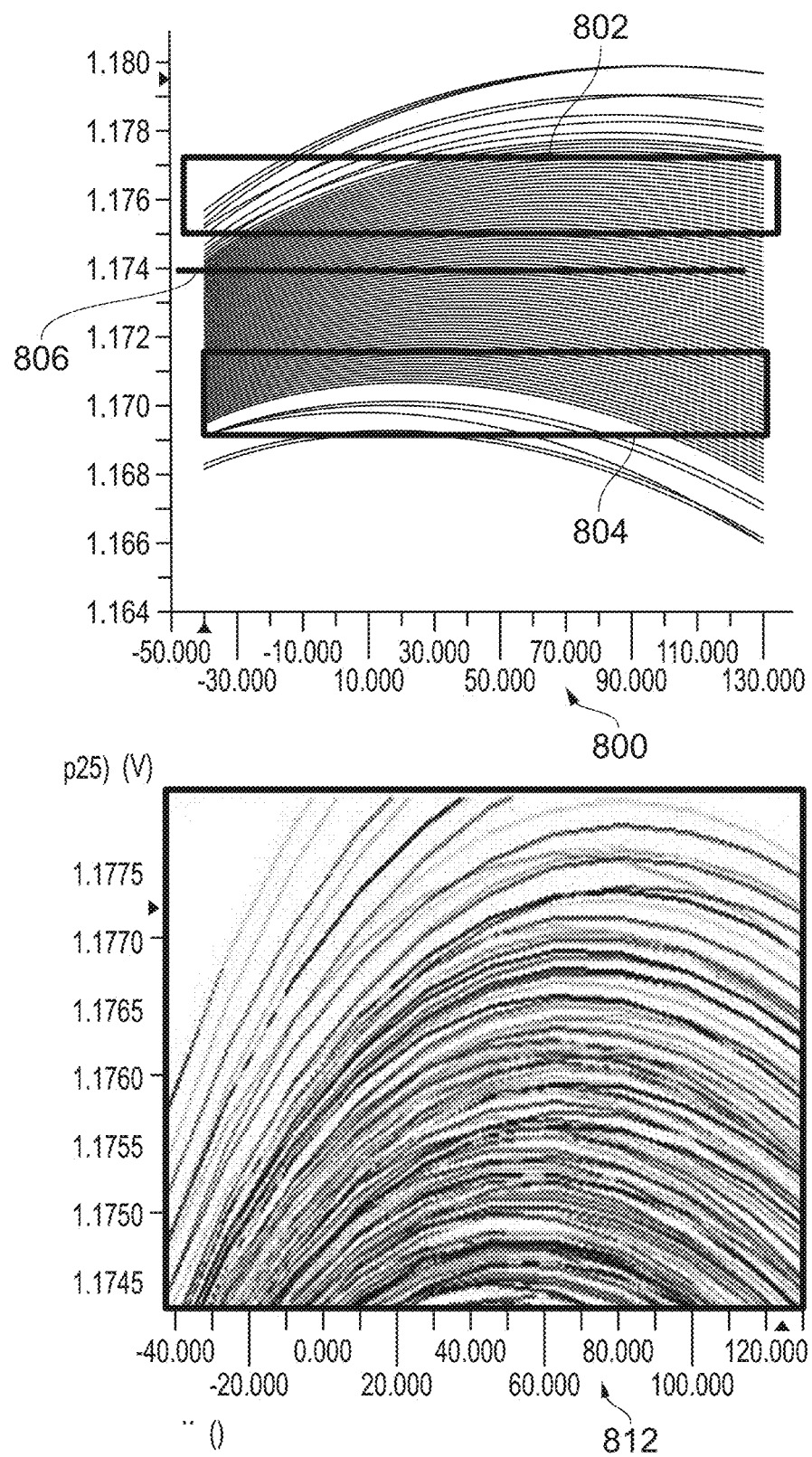
FIG. 8 shows an example embodiment of a set of computer simulation results, including expanded portions of some results that show greater detail.
Figure 8:
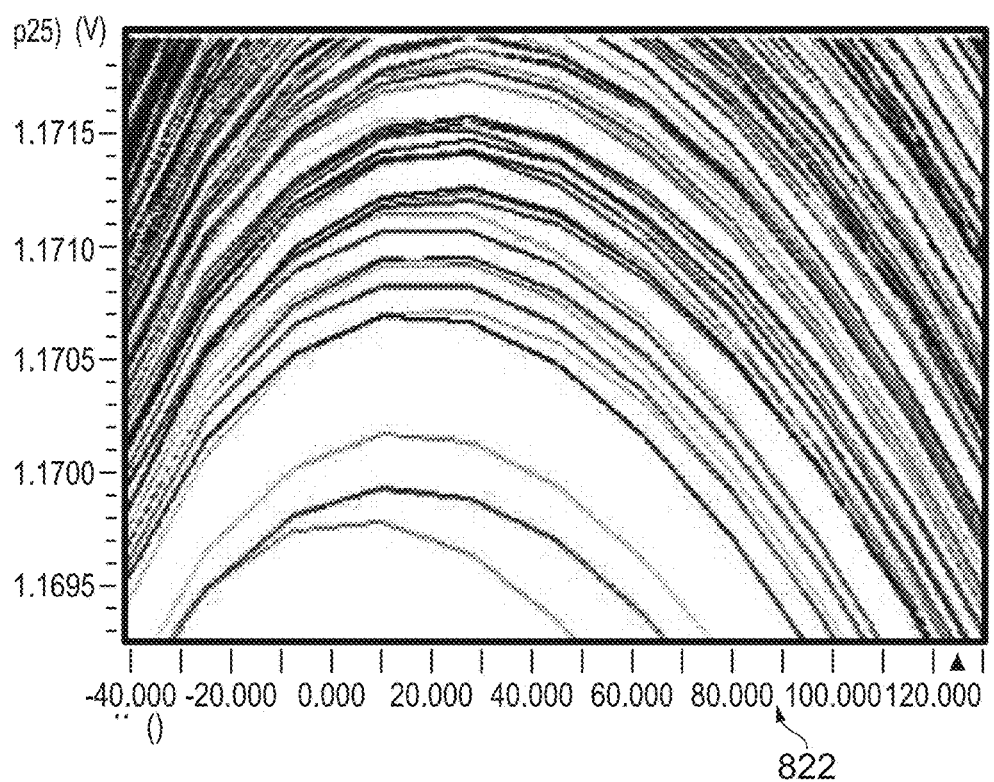

FIGS. 7 and 8 provide more evidence for the advantages of circuits with the second topology over those with the first topology. FIG. 7 shows the result of three hundred simulations of circuits with the first topology in a first chart 700. FIG. 7 also shows a second chart 712 that provides a close up view of a first region 702 of the first chart 700, and a third chart 722 that provide a close up view of a second region 704 of the first chart 700. In the first chart 700 the nominal voltage value is illustrated with a bold black line 706. In the second chart 712, all slopes should be positive, because they are above the nominal value. However, a first curve 714 and a second curve 716 have been highlighted, that clearly cross over each other. Similarly, a third curve 724 and a fourth curve 726 have been highlighted a crossing over each other in the third chart 722. These deviations mean that the circuits of the first topology have an inherent unpredictability, which is undesirable in voltage reference circuits, which should provide a specific voltage output with high reliability and little variation from one manufactured circuit to the next.

FIG. 8 shows results of similar simulations to those of FIG. 7, but these examples are simulations of circuits of the second topology, which includes the built in ΔVbe. Features similar to those of FIG. 7 have been given similar reference numerals and will not necessarily be discussed further here. It can clearly be seen that in both the second 812 and third 822 enlarged charts of FIG. 8, all the curves are homogeneous with no pairs of crossing lines. This means that the voltage reference circuits have a high quality, and predictability, from one circuit to the next.

The target of the band-gap voltage reference circuit is to provide an output voltage that is independent of the temperature, with a slope as close to 0 as possible. Advantageously, if the slope is proportional to the absolute value, then the absolute value can be measured in order to obtain information for adjusting the slope versus temperature. That is, if the absolute value is greater than the nominal value, then this means that the slope is positive, and a controller can therefore adjust the ratio R2/R1, in order to decrease the absolute value, and therefore also decrease the slope such that it is closer to the desired value of zero (if the slope of the BG value is positive then R2/R1 is decreased). Similarly, if the absolute value is less than the nominal value, then this means that the slope is negative, and the controller can therefore adjust the ratio R2/R1 in order to increase the absolute value, and therefore also increase the slope such that it is closer to the desired value of zero (if the slope of the BG value is negative then R2/R1 is increased). Therefore, the quality of the voltage reference circuits can be very important because it can be beneficial for: (i) the slope (positive or negative), to be related to (ii) the value of the output voltage at room temperature (over or under) relative to the nominal value. That is, if the slope is positive then the output voltage is over nominal; and if the slope is negative then the output voltage is under nominal. In which case, it may not be necessary to perform several tests at different temperatures to determine how to adjust the slope. If this were not the case, then several tests would have to be performed at different temperatures (at least two tests, for example at −50° C. and 150° C.) to determine how the band-gap slope should be adjusted. This would be independent of the absolute band-gap value. Therefore, examples disclosed herein can provide an advantage of reducing manufacturing and/or development testing costs.

Figure 9:
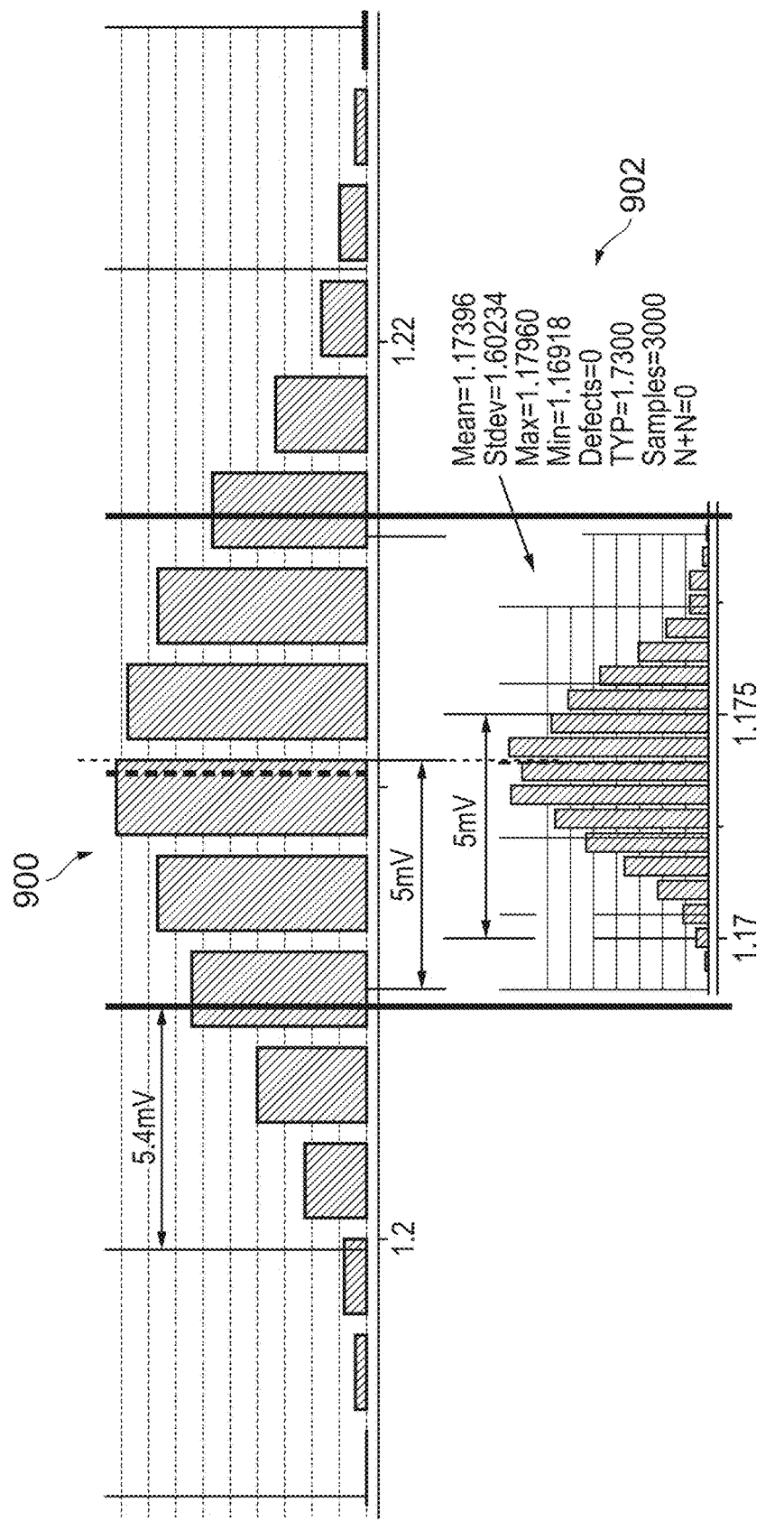
FIG. 9 shows an example embodiment of charts that provide details of voltage errors determined by computer simulations.

FIG. 9 shows the statistical distribution, in a first chart 900, of the three thousand simulations of the first circuit topology described above in relation to FIG. 7. FIG. 9 also shows the statistical distribution, in a second chart 902, of the three thousand simulations of the second circuit topology described above in relation to FIG. 8. Importantly, both statistical distributions are shown at the same scale. It is immediately clear that the statistical variability of the first topology is much greater than that of the second topology. This illustrates the advantages of circuits of the second topology over circuits of the first topology.

The second topology, with built-in offset-voltage ΔVbe, can be more accurate because it exhibits smaller standard deviation of voltage error. Also, the slope versus temperature can be well/perfectly matched with the delta V (ΔVbe) compared with the nominal voltage value (Vbg nominal). Nominal Vbg has a zero gradient slope versus temperature. This means that if an output voltage (Vbg) is greater than Vbg nominal, then the slope will be positive and negative if Vbg<Vbg nominal.

Voltage reference circuits of the present disclosure may be advantageous in a wide variety of applications because almost all electronic circuits need a voltage reference. A particularly advantageous application of circuits of this disclosure may be in Battery Management System (BMS) applications. BMS applications need very low tolerances, such as of less than 0.05% in voltage error. A significant problem is maintaining a voltage specification during a life time of a device, such as a BMS application. This will demand that the reference voltage should remain between +/−0.05% of a design specification voltage during the life time of the system. It is therefore advantageous to provide a well optimized voltage reference circuit with a good PN junction and bias resistance. This second voltage reference circuit topology of the present disclosure may be a good candidate for demanding BMS applications.

It will be appreciated that the voltage reference circuits according to the present disclosure may be provided as an integrated circuit or an electronic device.

According to a first aspect of the present disclosure there is provided a voltage reference circuit comprising:
  a main amplifier, comprising:
    a first-input-terminal;
    a second-input-terminal;
    an output-terminal configured to provide a reference-voltage-output-signal, wherein the output-terminal is connected to the first-input-terminal; and
    an offset-stage, connected to at least one of the first-input-terminal and the second-input-terminal;
  a first resistor, comprising:
    a first-resistor-terminal connected to the first-input-terminal; and
    a second-resistor-terminal connected to the second-input-terminal; and a PN junction, comprising:
    a first-junction-terminal connected to the second-resistor-terminal; and
    a second-junction-terminal connected to a reference terminal,
  wherein,
    the PN junction is configured, in use, to provide a junction-voltage, between the first-junction-terminal and the second-junction-terminal, wherein the junction-voltage decreases with increasing temperature, and
    the offset-stage is configured, in use, to provide an offset-voltage between the first-input-terminal and the second-input-terminal, wherein the offset-voltage increases with increasing temperature.

In one or more embodiments the voltage reference circuit further comprises a second resistor. The second resistor can be connected in series with the PN junction between the second-resistor-terminal and the reference-terminal.

In one or more embodiments the PN junction comprises one or more of: a diode; and a transistor connected as a diode.

In one or more embodiments the offset-stage comprises:
  a larger-area-transistor, comprising
    a conduction channel connected in series between the output-terminal and the reference terminal; and
    a control terminal connected to one of either:
      the first-input-terminal; or
      the second-input-terminal, and
  a smaller-area-transistor, comprising:
    a conduction channel connected in series between the output-terminal and the reference terminal; and
    a control terminal connected to one of either:
      the first-input-terminal, when the control terminal of the larger-area-transistor is connected to the second-input-terminal; or
      the second-input-terminal, when the control terminal of the larger-area-transistor is connected to the first-input-terminal, and
  wherein a current-conduction-area of the larger-area-transistor is greater than a current-conduction-area of the smaller-area-transistor.

In one or more embodiments the offset-stage comprises:
  a larger-area-PNP-transistor, comprising:
    a collector terminal coupled to the reference terminal;
    an emitter terminal coupled to the output-terminal; and
    a base terminal coupled to the first-input-terminal; and
  a smaller-area-PNP-transistor, comprising:
    a collector terminal coupled to the reference terminal;
    an emitter terminal coupled to the output-terminal; and
    a base terminal coupled to the second-input-terminal,
  wherein a current-conduction-area of the larger-area-PNP-transistor is greater than a current-conduction-area of the smaller-area-PNP-transistor.

In one or more embodiments the current-conduction-area of the larger-area-PNP-transistor is at least 2, 4, 8 or 16 times greater than a current-conduction-area of the smaller-area-PNP-transistor.

In one or more embodiments the offset-stage comprises:
  a larger-area-NPN-transistor, comprising:
    a collector terminal coupled to the output-terminal;
    an emitter terminal coupled to the reference terminal; and
    a base terminal coupled to the second-input-terminal; and
  a smaller-area-NPN-transistor, comprising:
    a collector terminal coupled to the output-terminal;
    an emitter terminal coupled to the reference terminal; and
    a base terminal coupled to the first-input-terminal, wherein a current-conduction-area of the larger-area-NPN-transistor is greater than a current-conduction-area of the smaller-area-NPN-transistor.

In one or more embodiments the current-conduction-area of the larger-area-NPN-transistor is at least 2, 4, 8 or 16 times greater than a current-conduction-area of the smaller-area-NPN-transistor.

In one or more embodiments the offset-stage further comprises:
  a larger-area-PNP-transistor, comprising:
    a collector terminal coupled to the reference terminal;
    an emitter terminal coupled to the output-terminal; and
    a base terminal coupled to the emitter terminal of the smaller-area-NPN-transistor; and
  a smaller-area-PNP-transistor, comprising:
    a collector terminal coupled to the reference terminal;
    an emitter terminal coupled to the output-terminal; and
    a base terminal coupled to the emitter terminal of the larger-area-NPN-transistor,
  wherein a current-conduction-area of the larger-area-PNP-transistor is greater than a current-conduction-area of the smaller-area-PNP-transistor.

In one or more embodiments a ratio of the current-conduction-area of the larger-area-NPN-transistor to the current-conduction-area of the smaller-area-NPN-transistor is the same as a ratio of the current-conduction-area of the larger-area-PNP-transistor to the current-conduction-area of the smaller-area-PNP-transistor.

In one or more embodiments the main amplifier comprises an output amplifier. The output amplifier may comprise: an output-amplifier-first-input-terminal; an output-amplifier-second-input-terminal; and an output-amplifier-output-terminal connected to the output-terminal of the main amplifier. The offset-stage may comprise:
  a larger-area-PNP-transistor, comprising:
    a collector terminal coupled to the reference terminal;
    an emitter terminal coupled to the output-terminal; and
    a base terminal coupled to the first-input-terminal; and
  a smaller-area-PNP-transistor, comprising:
    a collector terminal coupled to the reference terminal;
    an emitter terminal coupled to the output-terminal; and
    a base terminal coupled to the second-input-terminal, and
  wherein a current-conduction-area of the larger-area-PNP-transistor is greater than a current-conduction-area of the smaller-area-PNP-transistor, and
  wherein the output-amplifier-first-input-terminal is connected to the collector of the larger-area-PNP-transistor and the output-amplifier-second-input-terminal is connected to the collector of the smaller-area-PNP-transistor.

In one or more embodiments the voltage reference circuit further comprises:
  an impedance connected in series between: (i) the collector terminal of the smaller-area-PNP-transistor; and (ii) the reference terminal; and/or
  an impedance connected in series between: (i) the collector terminal of the larger-area-PNP-transistor; and (ii) the reference terminal.

In one or more embodiments the main amplifier is provided with a supply voltage from the output-terminal of the main amplifier.

In one or more embodiments the junction-voltage decreases with increasing temperature with a first gradient and the offset-voltage increases with increasing temperature with a second gradient, and wherein a magnitude of the first gradient is within 0.08% of a magnitude of the second gradient.

There may be provided an integrated circuit or an electronic device comprising any voltage reference circuit disclosed herein.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A voltage reference circuit comprising:
   a main amplifier, comprising:
      a first-input-terminal;
      a second-input-terminal;
      an output-terminal configured to provide a reference-voltage-output-signal, wherein the output-terminal is connected to the first-input-terminal, wherein the main amplifier is provided with a supply voltage from the output-terminal of the main amplifier;
      an offset-stage, connected to at least one of the first-input-terminal and the second-input-terminal;
   a first resistor, comprising:
      a first-resistor-terminal connected to the first-input-terminal; and
      a second-resistor-terminal connected to the second-input-terminal; and
   a PN junction, comprising:
      a first-junction-terminal connected to the second-resistor-terminal; and
      a second-junction-terminal connected to a reference terminal,
   wherein,
      the PN junction is configured, in use, to provide a junction-voltage, between the first-junction-terminal and the second-junction-terminal, wherein the junction-voltage decreases with increasing temperature, and
      the offset-stage is configured, in use, to provide an offset-voltage between the first-input-terminal and the second-input-terminal, wherein the offset-voltage increases with increasing temperature.

2. The voltage reference circuit of claim 1, further comprising a second resistor, wherein the second resistor is connected in series with the PN junction between the second-resistor-terminal and the reference-terminal.

3. The voltage reference circuit of claim 1, wherein the PN junction comprises one of a group consisting of:
   a diode; and
   a transistor connected as a diode.

4. The voltage reference circuit of claim 1, wherein the offset-stage comprises:
   a larger-area-transistor, comprising
      a conduction channel connected in series between the output-terminal and the reference terminal; and
      a control terminal connected to one of either:
         the first-input-terminal; or
         the second-input-terminal, and
   a smaller-area-transistor, comprising:
      a conduction channel connected in series between the output-terminal and the reference terminal; and
      a control terminal connected to one of either:
         the first-input-terminal, when the control terminal of the larger-area-transistor is connected to the second-input-terminal; or
         the second-input-terminal, when the control terminal of the larger-area-transistor is connected to the first-input-terminal, and
   wherein a current-conduction-area of the larger-area-transistor is greater than a current-conduction-area of the smaller-area-transistor.

5. The voltage reference circuit of claim 1, wherein the offset-stage comprises:
   a larger-area-PNP-transistor, comprising:
      a collector terminal coupled to the reference terminal;
      an emitter terminal coupled to the output-terminal; and
      a base terminal coupled to the first-input-terminal; and
   a smaller-area-PNP-transistor, comprising:
      a collector terminal coupled to the reference terminal;
      an emitter terminal coupled to the output-terminal; and
      a base terminal coupled to the second-input-terminal,
   wherein a current-conduction-area of the larger-area-PNP-transistor is greater than a current-conduction-area of the smaller-area-PNP-transistor.

6. The voltage reference circuit of claim 5, wherein the current-conduction-area of the larger-area-PNP-transistor is at least 2 times greater than a current-conduction-area of the smaller-area-PNP-transistor.

7. The voltage reference circuit of claim 1, wherein the offset-stage comprises:
   a larger-area-NPN-transistor, comprising:
      a collector terminal coupled to the output-terminal;
      an emitter terminal coupled to the reference terminal; and
      a base terminal coupled to the second-input-terminal; and
   a smaller-area-NPN-transistor, comprising:
      a collector terminal coupled to the output-terminal;
      an emitter terminal coupled to the reference terminal; and
      a base terminal coupled to the first-input-terminal,
   wherein a current-conduction-area of the larger-area-NPN-transistor is greater than a current-conduction-area of the smaller-area-NPN-transistor.

8. The voltage reference circuit of claim 7, wherein the current-conduction-area of the larger-area-NPN-transistor is at least 2 times greater than a current-conduction-area of the smaller-area-NPN-transistor.

9. The voltage reference circuit of claim 7, wherein the offset-stage further comprises:
   a larger-area-PNP-transistor, comprising:
      a collector terminal coupled to the reference terminal;
      an emitter terminal coupled to the output-terminal; and
      a base terminal coupled to the emitter terminal of the smaller-area-NPN-transistor; and
   a smaller-area-PNP-transistor, comprising:
      a collector terminal coupled to the reference terminal;
      an emitter terminal coupled to the output-terminal; and
      a base terminal coupled to the emitter terminal of the larger-area-NPN-transistor,
   wherein a current-conduction-area of the larger-area-PNP-transistor is greater than a current-conduction-area of the smaller-area-PNP-transistor.

10. The voltage reference circuit of claim 9, wherein a ratio of the current-conduction-area of the larger-area-NPN-transistor to the current-conduction-area of the smaller-area-NPN-transistor is the same as a ratio of the current-conduction-area of the larger-area-PNP-transistor to the current-conduction-area of the smaller-area-PNP-transistor.

11. The voltage reference circuit of claim 1, wherein the main amplifier comprises an output amplifier, the output amplifier comprising:

an output-amplifier-first-input-terminal;
an output-amplifier-second-input-terminal; and
an output-amplifier-output-terminal connected to the output-terminal of the main amplifier,
wherein the offset-stage comprises:
a larger-area-PNP-transistor, comprising:
   a collector terminal coupled to the reference terminal;
   an emitter terminal coupled to the output-terminal; and
   a base terminal coupled to the first-input-terminal; and
a smaller-area-PNP-transistor, comprising:
   a collector terminal coupled to the reference terminal;
   an emitter terminal coupled to the output-terminal; and
   a base terminal coupled to the second-input-terminal, and
wherein a current-conduction-area of the larger-area-PNP-transistor is greater than a current-conduction-area of the smaller-area-PNP-transistor, and
wherein the output-amplifier-first-input-terminal is connected to the collector of the larger-area-PNP-transistor and the output-amplifier-second-input-terminal is connected to the collector of the smaller-area-PNP-transistor.

12. The voltage reference circuit of claim 11, further comprising:
   an impedance connected in series between: (i) the collector terminal of the smaller-area-PNP-transistor; and (ii) the reference terminal; and
   an impedance connected in series between: (i) the collector terminal of the larger-area-PNP-transistor; and (ii) the reference terminal.

13. The voltage reference circuit of claim 1, wherein the junction-voltage decreases with increasing temperature with a first gradient and the offset-voltage increases with increasing temperature with a second gradient, and wherein a magnitude of the first gradient is within 0.08% of a magnitude of the second gradient.

14. An integrated circuit or an electronic device comprising the voltage reference circuit of claim 1.

* * * * *